United States Patent
Meyer-Berg et al.

(10) Patent No.: US 10,049,962 B2
(45) Date of Patent: Aug. 14, 2018

(54) ARRANGEMENT OF MULTIPLE POWER SEMICONDUCTOR CHIPS AND METHOD OF MANUFACTURING THE SAME

(71) Applicant: Infineon Technologies AG, Neubiberg (DE)

(72) Inventors: Georg Meyer-Berg, Munich (DE); Edward Fuergut, Dasing (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/171,364

(22) Filed: Jun. 2, 2016

(65) Prior Publication Data

US 2016/0358886 A1    Dec. 8, 2016

(30) Foreign Application Priority Data

Jun. 5, 2015    (DE) .................. 10 2015 108 909

(51) Int. Cl.
*H01L 23/13*    (2006.01)
*H01L 23/04*    (2006.01)
(Continued)

(52) U.S. Cl.
CPC ............ *H01L 23/44* (2013.01); *H01L 23/13* (2013.01); *H01L 24/32* (2013.01); *H01L 24/38* (2013.01); *H01L 24/40* (2013.01); *H01L 24/41* (2013.01); *H01L 24/92* (2013.01); *H01L 25/071* (2013.01); *H01L 23/5385* (2013.01); *H01L 24/29* (2013.01); *H01L 24/37* (2013.01); *H01L 24/83* (2013.01); *H01L 24/84* (2013.01); *H01L 25/0657* (2013.01); *H01L 2224/291* (2013.01); *H01L 2224/32227* (2013.01); *H01L 2224/3701* (2013.01); *H01L 2224/37147* (2013.01);
(Continued)

(58) Field of Classification Search
CPC ..... H01L 23/049; H01L 23/32; H01L 23/041; H01L 23/043; H01L 23/053; H01L 23/055; H01L 23/498; H01L 23/49838; H01L 23/538; H01L 23/5384; H01L 23/5386; H01L 21/673; H01L 21/67303; H01L 21/6732; H01L 21/67313; H01L 21/67326; H05K 7/0039; H05K 7/0091; H05K 7/023; H05K 7/081; H05K 7/0021; H05K 7/20
See application file for complete search history.

(56) References Cited

U.S. PATENT DOCUMENTS 4,266,282 A * 5/1981 Henle ................ H01L 23/5387
                                              257/E21.511
5,239,447 A * 8/1993 Cotues .................. H01L 24/49
                                              257/686
(Continued)

FOREIGN PATENT DOCUMENTS

WO        01/97286        12/2001

*Primary Examiner* — David Zarneke
(74) *Attorney, Agent, or Firm* — Dicke, Billig & Czaja, PLLC (57) ABSTRACT

A semiconductor power arrangement includes a chip carrier having a first surface and a second surface opposite the first surface. The semiconductor power arrangement further includes a plurality of power semiconductor chips attached to the chip carrier, wherein the power semiconductor chips are inclined to the first and/or second surface of the chip carrier.

12 Claims, 5 Drawing Sheets

(51) Int. Cl.
  *H01L 23/538* (2006.01)
  *H01L 25/065* (2006.01)
  *H01L 23/44* (2006.01)
  *H01L 25/07* (2006.01)
  *H05K 7/20* (2006.01)
  *H05K 7/08* (2006.01)
  *H05K 7/10* (2006.01)
  *H05K 7/02* (2006.01)
  *H01L 23/00* (2006.01)

(52) U.S. Cl.
  CPC ........... *H01L 2224/40227* (2013.01); *H01L 2224/40228* (2013.01); *H01L 2224/40499* (2013.01); *H01L 2224/4118* (2013.01); *H01L 2224/41051* (2013.01); *H01L 2224/831* (2013.01); *H01L 2224/8384* (2013.01); *H01L 2224/848* (2013.01); *H01L 2224/8484* (2013.01); *H01L 2224/9201* (2013.01); *H01L 2225/06555* (2013.01); *H01L 2225/06575* (2013.01); *H01L 2225/06582* (2013.01); *H01L 2924/15151* (2013.01); *H01L 2924/15153* (2013.01); *H05K 7/023* (2013.01); *H05K 7/08* (2013.01); *H05K 7/10* (2013.01); *H05K 7/20* (2013.01)

(56) References Cited

U.S. PATENT DOCUMENTS

| | | | | | |
|---|---|---|---|---|---|
| 5,247,433 A | * | 9/1993 | Kitaura | ............... | G06F 3/011 376/216 |
| 5,362,986 A | * | 11/1994 | Angiulli | ............. | H01L 25/0652 257/690 |
| 5,444,294 A | * | 8/1995 | Suzuki | ............. | H01L 23/49537 257/666 |
| 5,451,815 A | * | 9/1995 | Taniguchi | ......... | H01L 23/49811 257/696 |
| 5,545,924 A | * | 8/1996 | Contolatis | ............ | H01L 23/66 257/724 |
| 5,604,377 A | * | 2/1997 | Palagonia | ........... | H01L 25/0657 257/685 |
| 5,661,901 A | * | 9/1997 | King | ................... | H01L 25/0657 257/700 |
| 5,801,448 A | * | 9/1998 | Ball | .................... | H01L 25/0657 257/685 |
| 6,091,606 A | * | 7/2000 | Farnworth | ............. | H01L 23/32 174/260 |
| 6,140,696 A | * | 10/2000 | Kinsman | ............. | H01L 25/0657 257/678 |
| 6,147,411 A | * | 11/2000 | Kinsman | ............. | H01L 25/0657 257/777 |
| 6,191,474 B1 | * | 2/2001 | Kinsman | ................ | H01L 23/32 257/693 |
| 6,265,773 B1 | * | 7/2001 | Kinsman | ................ | H01L 25/105 257/685 |
| 6,383,839 B2 | * | 5/2002 | Kinsman | ............. | H01L 25/0657 257/E25.013 |
| 6,417,024 B2 | * | 7/2002 | Kinsman | ............. | H01L 25/0657 257/777 |
| 6,418,033 B1 | * | 7/2002 | Rinne | ................ | H01L 25/0657 257/685 |
| 6,870,261 B2 | * | 3/2005 | Hu | ....................... | H01L 23/041 257/678 |
| 6,958,533 B2 | * | 10/2005 | Sullivan | ............. | H01L 25/0657 257/686 |
| 7,050,303 B2 | * | 5/2006 | Park | ...................... | H01L 25/0655 165/185 |
| 7,061,089 B2 | * | 6/2006 | Kuzmenka | ............... | G11C 5/04 257/686 |
| 8,053,891 B2 | * | 11/2011 | Feng | ...................... | H01L 24/16 257/693 |
| 8,703,543 B2 | * | 4/2014 | Wan | ...................... | B81B 3/0054 257/417 |
| 2004/0084211 A1 | * | 5/2004 | Fayfield | ........... | H01L 23/49805 174/261 |
| 2004/0164406 A1 | | 8/2004 | Hu et al. | | |
| 2009/0072823 A1 | * | 3/2009 | Wan | ...................... | G01R 33/0206 324/247 |
| 2011/0057306 A1 | * | 3/2011 | McShane | ................ | H01L 24/13 257/706 |

* cited by examiner

Attaching a plurality of power semiconductor chips to a chip carrier, the chip carrier having a first surface and a second surface opposite the first surface, wherein the power semiconductor chips are inclined to the first and/or second surface of the chip carrier — S1

Fig. 9

ARRANGEMENT OF MULTIPLE POWER SEMICONDUCTOR CHIPS AND METHOD OF MANUFACTURING THE SAME

CROSS-REFERENCE TO RELATED APPLICATION

This Utility Patent Application claims priority to German Patent Application No. 10 2015 108 909.2, filed Jun. 5, 2015; and which is incorporated herein by reference.

TECHNICAL FIELD

This invention relates to the technique of arranging multiple power semiconductor chips, and in particular to high density arrangements of power semiconductor chips.

BACKGROUND

Power semiconductor device manufacturers are constantly striving to increase the performance of their products, while decreasing their cost of manufacture. A cost intensive area in the manufacture of power semiconductor arrangements is packaging the power semiconductor chip. As the performance of semiconductor power arrangements is strongly dependent from the heat dissipation capability provided by the package, high effort, expenditure and cost are needed for implementing semiconductor power arrangements comprising a plurality of densely packed power semiconductor chips. As such, low cost semiconductor power arrangements of high thermal robustness, improved heat dissipation capability and increased reliability and electrical performance are desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and, together with the description, serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other unless specifically noted otherwise.

Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or " electrically connected/electrically coupled" elements, respectively.

Further, the words "over" or "above" used with regard to a part, element or material layer formed or located "over" or "above" a surface may be used herein to mean that the part, element or material layer be located (e.g. placed, formed, deposited, etc.) "directly on", e.g. in direct contact with, the implied surface. The words "over" or "above" used with regard to a part, element or material layer formed or located "over" or "above" a surface may be used herein to mean that the part, element or material layer be located (e.g. placed, formed, deposited, etc.) "indirectly on" the implied surface with one or more additional parts, elements or layers being arranged between the implied surface and the part, element or material layer. The same applies analogously to the terms or "under", "below", "beneath", etc.

The semiconductor power arrangements described herein contain a plurality of power semiconductor chips. These power semiconductor chips may be of different types and may be manufactured by different technologies. They include (monolithic) power integrated circuits and may further include, for example, logic integrated circuits, analogue integrated circuits, mixed signal integrated circuits, memory circuits, or sensors. The power semiconductor chips referred to herein may be manufactured from specific semiconductor material such as, for example, Si, SiC, SiGe, GaAs, GaN, AlGaN, InGaAs, InAlAs, etc, and, furthermore, may contain inorganic and/or organic materials that are not semiconductors.

The power semiconductor chips referred to herein may, e.g., be power switches, power transistors, power diodes, etc. They may additionally include control circuits, microprocessors, memory circuits and/or sensors.

The power semiconductor chips referred to herein may, for example, be configured as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., a PIN diode or a Schottky diode.

The power semiconductor chips referred to herein may, e.g., have a vertical structure, that is to say that the semiconductor chips may be fabricated in such a way that electric currents can flow in a direction perpendicular to the main surfaces of the semiconductor chips. A power semiconductor chip having a vertical structure has electrodes on its two main surfaces, that is to say on its top and bottom side surfaces.

The power semiconductor chips referred to herein may have a horizontal structure. A power semiconductor chip having a horizontal structure often has chip electrodes only on one of its two main surfaces, e.g., on its active surface.

The semiconductor power arrangement described herein comprises a chip carrier to which a plurality of power semiconductor chips is attached. The chip carrier may comprise, e.g., a plate of ceramics coated with one or more structured metal layer(s), e.g. a metal bonded ceramics substrate. By way of example, the chip carrier may comprise or be a DCB (direct copper bonded) ceramics substrate. It is also possible that the chip carrier may comprise or be a PCB (printed circuit board). The PCB may, e.g., comprise or be a multi-layer PCB having a plurality of stacked organic and metal layers, wherein the metal layers may form a wiring or electrical interconnect of the PCB. Further, the chip carrier may, e.g., comprise or be a leadframe, an IMS (isolated metal substrate), or a MIS (molded interconnect substrate), such as, e.g. a molded interconnect ceramic interposer or a molded interconnect leadframe(s). It is to be noted that further electronic component(s) other than the power semiconductor chips may also be mounted and electrically connected to the chip carrier. The further electronic components may be designed as passive and/or active components. A passive component may, e.g., be a resistor, a capacitor, an inductor, a clock, and/or an integrated passive device (PID). An active component may, e.g., be a logic semiconductor chip, a memory semiconductor chip, a driver semiconductor chip to drive one or more of the power semiconductor chips, a level shifter, and a microcontroller chip, or a sensor. In contrast to the power semiconductor chip(s), the (further) electronic components may, e.g., be mounted in a standard SMD technique on the chip carrier.

A variety of different types of semiconductor power arrangements may be designed in accordance with the disclosure herein. In particular, a semiconductor power arrangement described herein may comprise a plurality of half-bridge circuits including a high side transistor, a low side transistor and, optionally, a logic integrated circuit chip serving as, e.g., a transistor gate driver. Further, the semiconductor power arrangement disclosed herein may comprise a full-bridge such as, e.g., a B6 circuit including, e.g., 6power transistors and (optionally) a logic integrated circuit chip serving as, e.g., a power transistor gate driver.

The power semiconductor chips may, e.g., be connected in series, in parallel or may be electrically isolated from each other. The electrical interconnection between the power semiconductor chips may be provided by the wiring of the chip carrier.

Semiconductor power module arrangements as described herein may, e.g., be implemented in various electronic circuits such as, e.g., circuits constituting or containing a power supply, a voltage converter, a rectifier, a PFC (power factor correction) circuit, etc. By way of example, a voltage converter may be configured for converting DC or AC voltages into DC voltages, so-called DC-DC converters and AC-DC converters, respectively. DC-DC converters may be used to convert a DC input voltage provided by a battery or rechargeable battery into a DC output voltage matched to the demands of electronic circuits connected downstream. A DC-DC converter described herein may, e.g., be a buck converter or a boost-converter. AC-DC converters may be used to convert an AC input voltage provided by, e.g., a high voltage AC power network into a DC output voltage matched to the demands of electronic circuits connected downstream.

Figure 1:
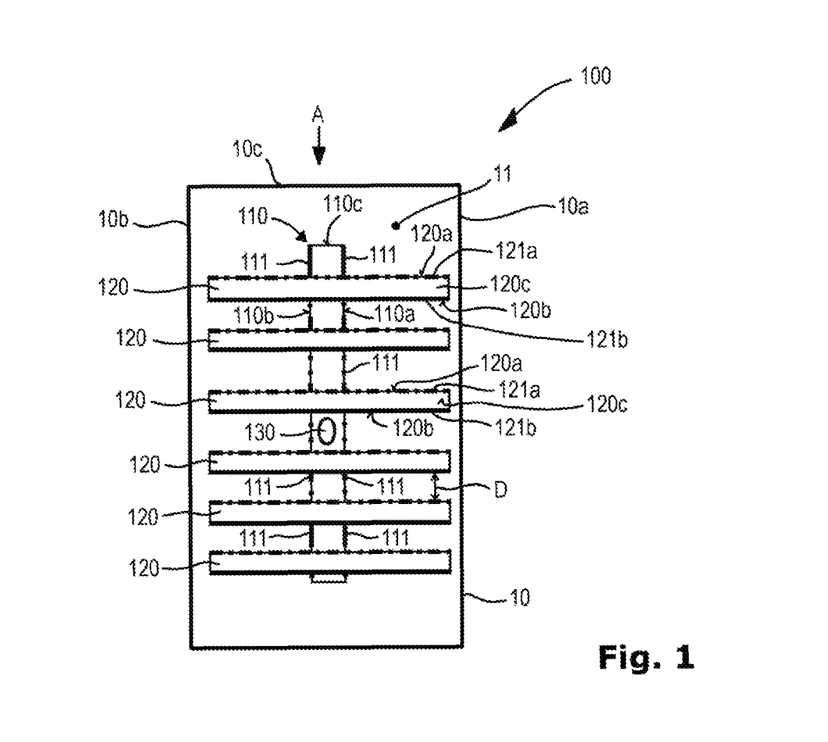
FIG. 1 schematically illustrates a top view of an exemplary semiconductor power arrangement including a carrier and a plurality of power semiconductor chips attached to the carrier by through connection techniques.

FIG. 1 illustrates a top view of an exemplary semiconductor power arrangement 100 when introduced into a container 10. As will be described further below in greater detail, the container 10 may be filled with a cooling fluid, wherein the plurality of the power semiconductor chips are intended to be submerged in the cooling fluid.

The semiconductor power arrangement includes a chip carrier 110 having a first surface 110a and a second surface 110b opposite the first surface 110a. The chip carrier 110 may have the shape of a plate, wherein the first surface 110a and the second surface 110b are the main surfaces of the plate, and an upper surface 110c, which is visible in the top view of FIG. 1, is an edge surface of the plate.

The chip carrier 110 comprises an electrical wiring 111. The electrical wiring 111 may comprise structured metal layers disposed on one or both of the first surface 110a and the second surface 110b of the chip carrier 110. Further, the electrical wiring may comprise or be configured as an internal electrical interconnect of the chip carrier 110, which may, e.g., be implemented by structured metal layers extending along the direction of the main plane of the chip carrier 110. The main plane of the chip carrier 110 may be defined by the plate-shaped extension of the chip carrier 110 (see e.g. FIG. 2).

The chip carrier 110 may further comprise an electrical connector 113. The electrical connector 113 may be electrically connected to the electrical wiring 111, e.g. to the internal electrical interconnect of the chip carrier 110, if any, and/or to the structured metal layers disposed on the first surface 110a and/or the second surface 110b of the chip carrier 110.

As already mentioned, the chip carrier 110 may be of any appropriate type, e.g. may comprise a PCB or a ceramic plate covered by structured metal layers or may be a plastic plate comprising an electrical wiring 111 as exemplified above. Further, it may comprise a leadframe, a MIS or an IMS. As will become more comprehensible further below, the chip carrier 110 may be a standard low-cost carrier, because its capability of dissipating heat and promoting heat removal is typically of minor significance for the semiconductor power arrangements described herein.

A plurality of power semiconductor chips 120 is attached to the chip carrier 110. The power semiconductor chips 120 are inclined to the first surface 110a and/or to the second surface 110b of the chip carrier 110. In particular, as illustrated in FIG. 1, the power semiconductor chips 120 may be arranged perpendicular to the first surface 110a and/or the second surface 110b of the chip carrier 110, i.e. to the main plane of the plate-shaped chip carrier 110. As mentioned above, in this and all other examples described herein, further electronic component(s) (not shown) other than the power semiconductor chips 120 may be mounted to the chip carrier 110. The further electronic components may be designed as passive and/or active components.

In the following, without loss of generality and in order to facilitate the description, the power semiconductor chips 120 are assumed to be oriented perpendicular to the chip carrier 110. However, in general, any angle of inclination between the power semiconductor chips 120 and the chip carrier 110 (or, more precisely, the main plane thereof) may be feasible, e.g. angles of equal to or less than 80°, 70°, 60°, 50°, etc.

The power semiconductor chips 120 may be oriented parallel to each other. A distance D between adjacent power semiconductor chips 120 may be equal to or less than 4.0 mm, 3.0 mm, 2.0 mm, 1.5 mm, 1.0 mm, 0.75 mm, 0.5 mm, 0.3 mm. As will become better understood for reasons set out further below, rather short distances D between adjacent power semiconductor chips 120 may be achieved. In other words, a highly dense chip arrangement may be obtained by the technique described herein.

It is to be noted that the intermediate distance D between adjacent power semiconductor chips 120 may but must not need to be identical for all semiconductor chip pairs. More specifically, the distance D may be subject to variations for different pairs of power semiconductor chips 120. By way of example, such variations may be based on design constrains such as, e.g., the location of the connector 113 which necessitates more space between neighbouring power semiconductor chips 120. In other cases the distance D and/or variations of the distance D may be based on electrical constrains such as, e.g., the creepage distance (cd) which has to be guaranteed as a minimum spacing between adjacent power semiconductor chips 120. The creepage distance may depend from the dielectric strength of the medium (e.g. cooling fluid) between the adjacent power semiconductor chips 120 and may also depend from the operation voltage of the power semiconductor chips 120. Thus, if some of the power semiconductor chips 120 do have a different operational voltage than other of the power semiconductor chips 120, the creepage distance between different pairs of power semiconductor chips 120 may vary, and so may do the distances D therebetween. Still further, the (minimum) distance D may depend from thermal constraints, e.g. from the power class of the power semiconductor chips 120 and/or from the heat removal capability of the medium (cooling fluid) between the power semiconductor chips 120, which could depend on many parameters such as, e.g., the chemical composition of the cooling fluid, the power of a heat exchanger for the cooling fluid, flow rates of fluid currents at the power semiconductor chips 120 in the container 10, the inclination angles of the power semiconductor chips 120 relative to the chip carrier 110, etc.

The semiconductor power chips 120 may be bare chips. The expression bare chip means that the power semiconductor chip is merely provided with load and control electrodes, if any, and, optionally with electrical traces connecting to these electrodes and extending over the power semiconductor chip 120, but without any molded or laminated encapsulation embedding the power semiconductor chip 120. Such molded or laminated organic encapsulation bodies are often used in the art to package power semiconductor chips, but may be omitted in the examples described herein for reasons which will become better understandable from the description further below.

The power semiconductor chips 120 may each have a first surface 120a and a second surface 120b opposite to the first surface 120a. One or both of these surfaces 120a, 120b may be equipped with electrodes, e.g. load electrodes and/or control electrodes. Typically, if the power semiconductor chips 120 are vertical devices, load electrodes are located on both surfaces 120a, 120b of the power semiconductor chips 120. If the power semiconductor chips 120 are horizontal devices, the load electrodes are typically located only on one of the first surface 120a and the second surface 120b.

The power semiconductor chips 120 may be provided with a first metallization layer 121a extending over the first surface 120a and/or with a second metallization layer 121b extending over the second surface 120b. Each of the first and second metallization layers 121a, 121b may either be continuous or may be structured, i.e. may be divided into a plurality of insular sections.

The first and second insulation layers 121a, 121b may provide for the chip electrodes. Thus, no metal traces connected to the electrodes are provided. The power semiconductor chips 120, in this case, simply correspond to a power semiconductor chip with fabricated chip electrodes. In other examples, the first metallization layer 121a and/or the second metallization layer 121b may further provide for metal traces running over the power semiconductor chip 120 and configured to connect the power semiconductor chip electrodes to the chip carrier 110.

In other words, the first and second metallization layers 121a, 121b, illustrated in FIG. 1, may be implemented by chip electrodes or reinforced chip electrodes (e.g. galvanically or chemically or physically reinforced chip electrodes) or by metal traces connecting to the chip electrodes (wherein the metal traces may also be fabricated by galvanic or chemical or physical deposition).

The first and/or second metallization layers 121a, 121b of the power semiconductor chips 120 may be electrically connected to the wiring 111 of the chip carrier 110. Connection may be made to any internal electrical interconnect or external structured metal layers of the wiring 111.

Further, referring to FIG. 1, the power semiconductor chips 120 are shown to penetrate the chip carrier 110 while an upper edge side 120c of the power semiconductor chips 120 remains visible in the top view of FIG. 1. This corresponds to a slit-shaped design of the chip carrier 110. In other examples the power semiconductor chips 120 may penetrate the chip carrier 110 by passing through through-holes therein. In this case, the upper edge side 120c of the power semiconductor chips 120 would only be visible in the exterior of the chip carrier 110.

Figure 2:
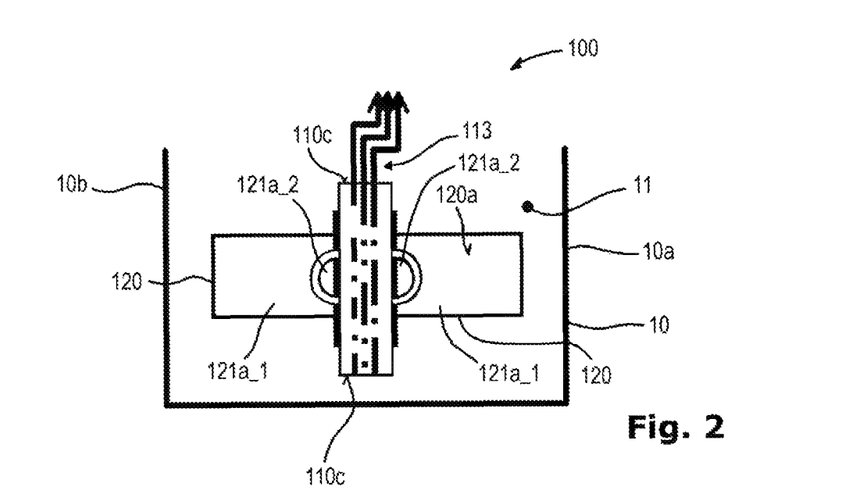
FIG. 2 schematically illustrates a side view of the exemplary semiconductor power arrangement of FIG. 1 as seen from point A of FIG. 1.

FIG. 2 illustrates a side view of the power arrangement 100 of FIG. 1 as seen from point A of FIG. 1 and assuming the side wall 10c of the container 10 to be transparent. Further side walls 10a and 10b are also illustrated in FIGS. 1 and 2.

As an example, the front power semiconductor chip 120, as apparent in FIG. 2, has a first metallization layer 121a which is structured. By way of example, it is structured to comprise a first section 121a_1 and a second section 121a_2. As described above, these first and second sections 121a_1 and 121a_2 may correspond to (optionally reinforced) chip electrodes and may be directly connected to the wiring 111 of the chip carrier 110. This implies that both chip electrodes as represented by the first and second sections 121a_1, 121a_2 overlap with the geometry of the chip carrier 110. Otherwise, as already mentioned before, the first metallization layer 121a may additionally be provided with electrical traces to interconnect chip electrodes with the wiring 111 of the chip carrier 110.

By way of example, with further reference to FIG. 2, without loss of generality, the power semiconductor chip 120 may, e.g., be configured as a power transistor, for example, a power MOSFET, IGBT, JFET or power bipolar transistor, or a power diode. In the case of a power MOSFET or a JFET, a first load electrode, which may be provided by a first section 121a_1 of the first metallization layer 121a, may be a source electrode, a second load electrode, which may be provided by the second metallization layer 121b may, e.g., be a drain electrode, and a third electrode, which may be provided by a second section 121a_2 of the first metallization layer 121a, may be a gate electrode. In the case of an IGBT, analogously, a first load electrode (e.g. first section 121a_1 of the first metallization layer 121a) may be an emitter electrode, a second load electrode (e.g. the second metallization layer 121b) may be a collector electrode, and a third electrode (e.g. a second section 121a_2 of the first metallization layer 121a) may be a gate electrode. In the case of a power bipolar transistor, the first load electrode may be an emitter electrode, the second load electrode may be collector electrode, and a third electrode may be a base electrode. In the case of a power diode, first and second load electrodes are cathode and anode, respectively, and there is no third electrode. During operation, voltages higher than 5, 50, 100, 500, 1000 or 1200 V may be applied between the first and second load electrodes. A switching frequency applied to the third electrode may be in the range from 100 Hz to 100 MHz, but may also be outside of this range.

Figure 3:
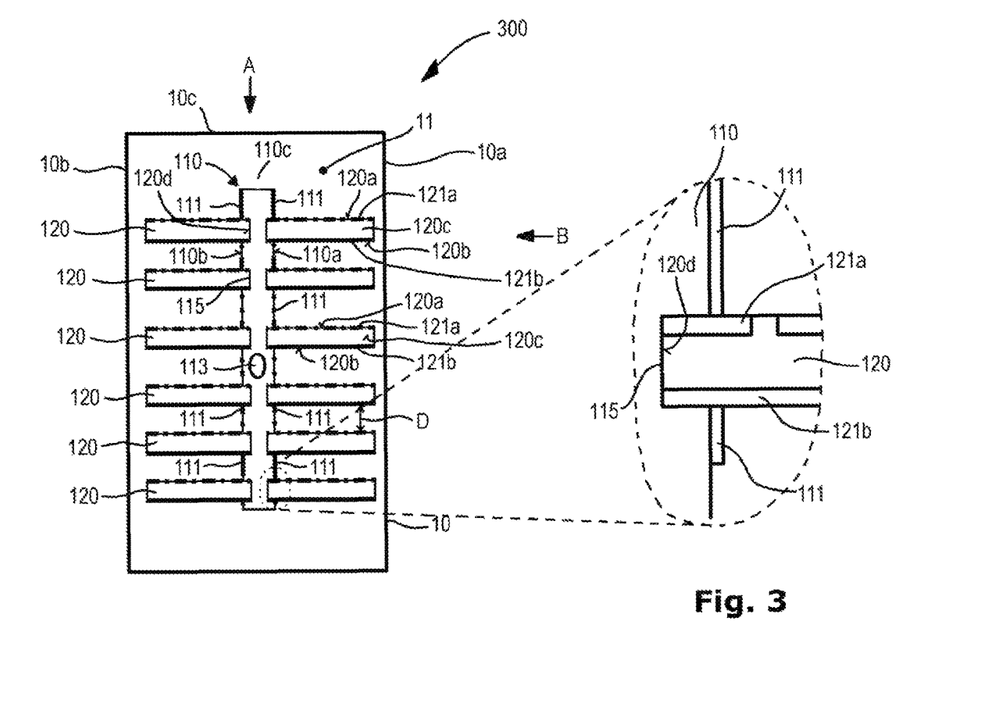
FIG. 3 schematically illustrates a top view of an exemplary semiconductor power arrangement including a carrier and a plurality of power semiconductor chips attached to the carrier by a surface mounting technique.
Figure 4:
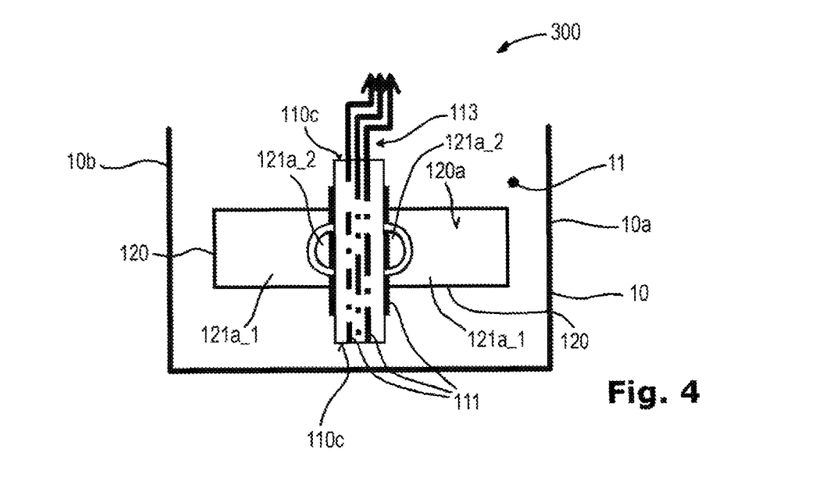
FIG. 4 schematically illustrates a side view of the exemplary semiconductor power arrangement of FIG. 3 as seen from point A of FIG. 3.

FIGS. 3 and 4 illustrate a top view and a side view from point A, respectively, of a semiconductor power arrangement 300. The semiconductor power arrangement 300 may be similar and, in most features, identical to the semiconductor power arrangement 100, and reference is made to the above disclosure in order to avoid reiteration.

Different to semiconductor power arrangement 100, the power semiconductor chips 120 of semiconductor power arrangement 300 do not penetrate the chip carrier 110. Rather, the power semiconductor chips 120 are surface mounted on at least one of the first surface 110a and the second surface 110b of the chip carrier 110.

As such, edges of the power semiconductor chips 120 may be mounted on at least one of the first surface 110a and the second surface 110b of the chip carrier 110. Mounting may comprise fixing the power semiconductor chips 120 by a bond material (not shown) such as, e.g., a solder or a sinter or a plating material, to the wiring 111 of the chip carrier 110.

Further, the chip carrier 110 may be provided with a pattern of trenches 115 in at least one of the first and second surfaces 110a, 110b. In this case, an edge portion of the power semiconductor chips 120 may be inserted in corresponding trenches 115 of the first or second surfaces 110a, 110b, see the enlarged portion of FIG. 3. This facilitates the pick-and-place process for disposing the power semiconductor chips 120 in upright position on the chip carrier 110.

As illustrated by way of example in FIG. 3, the chip carrier 110 may be configured to hold individual power semiconductor chips 120 on both surfaces 110a and 110b. This further increases the chip density of the semiconductor power arrangement 300.

Referring to FIG. 4, two separate power semiconductor chips 120 are visible, one attached to the first surface 110a of the chip carrier 110 and one attached to the second surface 110b of the chip carrier 110. Thus, in the exemplary semiconductor power arrangement 300, the second section 121a_2 of the first metallization layer 121a may be located at the "mounting" edge 120d of each power semiconductor chip 120.

Figure 5:
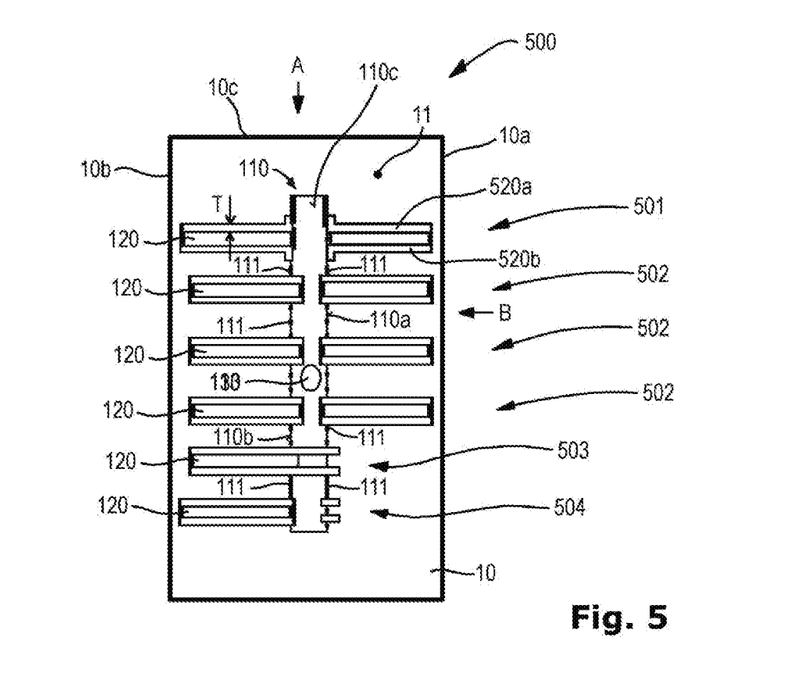
FIG. 5 schematically illustrates a top view of an exemplary semiconductor power arrangement including a carrier and a plurality of power semiconductor chips attached to the carrier by metal foil support or wrap techniques.
Figure 6:
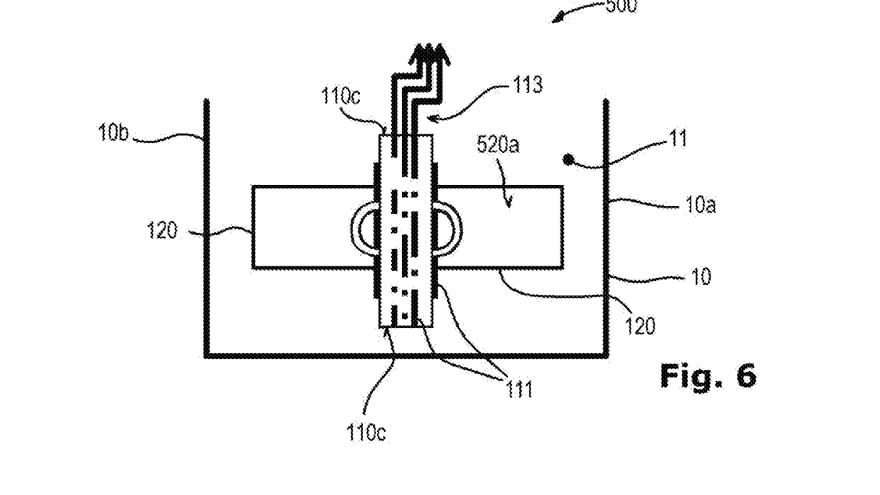
FIG. 6 schematically illustrates a side view of the exemplary semiconductor power arrangement of FIG. 5 as seen from point A of FIG. 5.

FIGS. 5 and 6 illustrate a top view and a side view as seen from point A of FIG. 5, respectively, of a semiconductor power arrangement 500. The semiconductor power arrangement 500 may be similar or in most features identical to semiconductor power arrangements 100, 300. As such, reference is made to the description above in order to avoid reiteration.

In semiconductor power arrangement 500 the power semiconductor chips 120 are attached to and supported by at least one of a first side metal foil 520a and/or a second side metal foil 520b. If both metal foils 520a, 520b are used, the power semiconductor chips 120 may each be sandwiched between these metal foils 520a, 520b. The first side metal foil 520a may cover at least a part of the first surface 120a of the power semiconductor chip 120, and/or the second side metal foil 520b may cover at least a part of the second surface 120b of the power semiconductor chip 120. The first side metal foil 520a and the second side metal foil 520b may be electrically insulated against each other. The first side metal foil 520a may connect to one or more chip electrodes on the first surface 120a of the power semiconductor chip 120, and/or the second side metal foil 520b may connect to one or more chip electrodes on the second surface 120b of the power semiconductor chip 120. If one or both of the first and second surfaces 120a, 120b contain a plurality of chip electrodes, the corresponding first and second side metal foils 520a, 520b may be split into different portions or stripes which may be electrically insulated against each other and which may each be connected to a chip electrode.

The first side metal foil 520a and/or the second side metal foil 520b may be fixed to the chip carrier 110. Various examples for fixing the first and/or second side metal foils 520a, 520b are illustrated in FIG. 5. By way of example, as illustrated at 501, the first side metal foil 520a and/or the second side metal foil 520b may be bent at their ends facing the chip carrier 110 to provide for flanges which could be attached (e.g. soldered, sintered, etc.) to the chip carrier 110 or, more precisely, to metal layers of the wiring 111 disposed on the first and/or second surfaces 110a, 110b of the chip carrier 110.

At 502 another solution is shown in which the ends of the first and second side metal foils 520a, 520b facing the chip carrier 110 are inserted into slits provided in the chip carrier 110. This solution uses a plug-in connection technique for securing the first and second metal foils 520a, 520b with the power semiconductor chips 120 arranged therebetween at the chip carrier 110.

At 503 another example is illustrated in which the chip carrier 110 has a slot in its top surface 110c and the first and/or second metal foils 520a, 520b are inserted in this slot.

At 504 still another exemplary solution is illustrated in which the chip carrier 110 may have a through-hole and the first side and/or the second side metal foils 520a, 520b are configured to pass through the through-hole when the power semiconductor chip 120 is fixed in place.

In all these examples for fixing the power semiconductor chips 120 to the chip carrier 110, the first side and/or the second side metal foils 520a, 520b may be fixed and electrically connected or bonded to the chip carrier 110, e.g. to the wiring 111 thereof. Further, in all the examples at 501, 502, 503, 504 the first side metal foil 520a and/or the second side metal foil 520b may be configured to mechanically hold the power semiconductor chip 120 in place. By way of example, a thickness of the first side metal foil 520a and/or the second side metal foil 520b may be equal to or greater than 100 µm, 200 µm, 300 µm, 400 µm, or more. This ensures that the mechanical stability and rigidity of the first side and/or second side metal foils 520a, 520b are good enough in order to guarantee a safe connection of the power semiconductor chip 120 to the chip carrier 110. Further, the greater the thickness T, the better is the capability of the first side and/or second side metal foils 520a, 520b to carry current peaks. On the other hand, the thickness T of the first side and/or second side metal foils 520a, 520b should not be too large, since the foils may act as thermal insulators and therefore, increasing the thickness T increases the thermal resistance between the power semiconductor chips 120 and the medium (cooling fluid) intended to be contained in the interior 11 of the container 10. The metal foils may comprise or be of any metal material, e.g. a metal material having a good thermal conductivity such as, e.g., copper or an alloy thereof. The metal foils 520a, 520b may also comprise other materials (e.g. dielectrics, organic material, polymer material) or reinforcing layer(s) comprising or being made of these materials (e.g. dielectric layer, organic layer, polymer layer). As such, the term metal foil as used herein is intended to also comprise compound layer structures including at least one metal foil.

Figure 7:
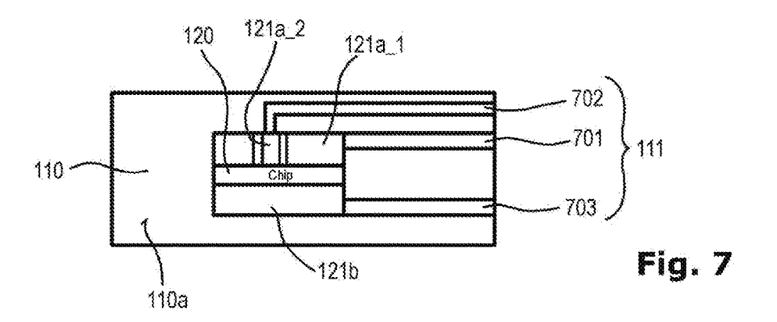
FIG. 7 schematically illustrates a side view of a portion of an exemplary semiconductor power arrangement as seen from, e.g., point B of FIG. 3.

FIG. 7 illustrates a side view of a portion of an exemplary semiconductor power arrangement 300 as seen from, e.g., point B of FIG. 3. A first (e.g. reinforced) metallization layer 121a is split into a first section 121a_1 corresponding to a source lead and a second section 121a_2 corresponding to a gate lead. The second (e.g. reinforced) metallization layer 121b serves as a drain lead. At the chip carrier 110, the source, gate and drain leads are connected to metal layers 701, 702, 703 forming part of the wiring 111.

The exemplary structure of the first (e.g. reinforced) metallization layer 121a and the second (e.g. reinforced) metallization layer 121b as shown in FIG. 7 may analogously correspond to the structure of the first side metal foil 520a and/or the second side metal foil 520b in FIGS. 5 and 6. That is, the structure of the first side metal foil 520a may comprise, e.g., a source lead and a gate lead and/or the structure of the second side metal foil 520b may comprise, e.g., a drain lead.

Figure 8:
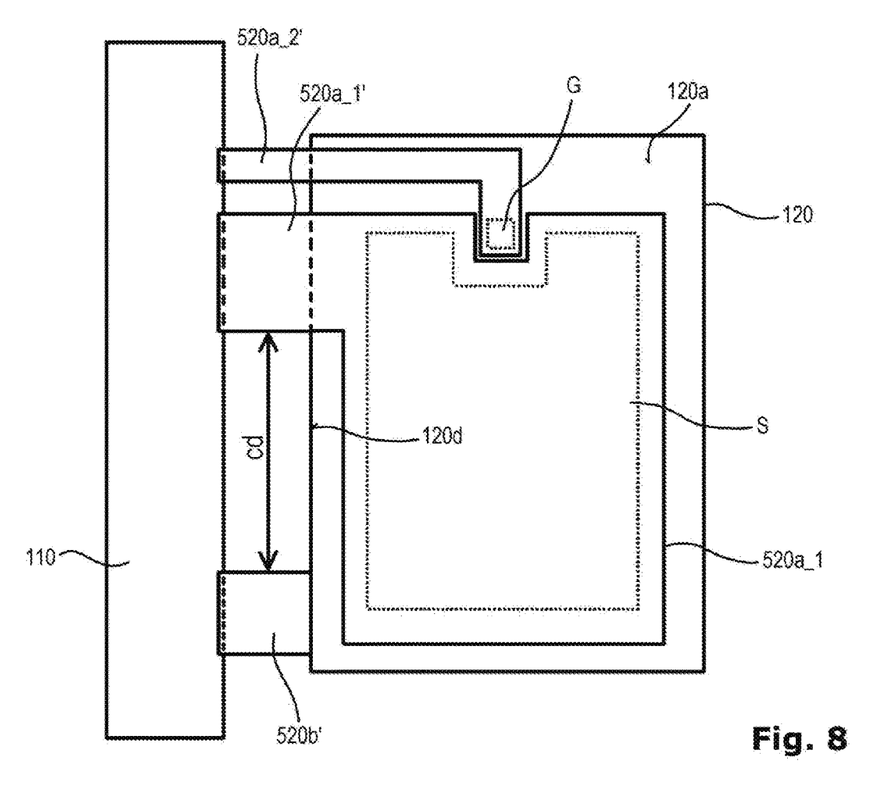
FIG. 8 schematically illustrates a side view of a portion of an exemplary semiconductor power arrangement as seen from, e.g., point A of FIG. 5.

FIG. 8 illustrates a side view of a portion of an exemplary semiconductor power arrangement 500 as seen from, e.g., point A of FIG. 5. As already described, the exemplary semiconductor arrangement 500 exemplifies "foil routing" from the power semiconductor chips 120 to the chip carrier 110. In this example, the first surface 120a of the power semiconductor chip 120 contains, e.g., a gate electrode G and a source electrode S. A drain electrode is, e.g., located at the second surface 120b of the power semiconductor chip 120, which is not visible in FIG. 8.

The second side metal foil 520b covers the drain electrode and includes a stripe 520b' by which it is connected to the chip carrier 110. The source electrode S is covered by a first section 520a_1 of the first side metal foil 520a which comprises a stripe 520a_1' by which it is connected to the chip carrier 110. The gate electrode G is covered by a second section 520a_2 of the first side metal foil 520a which comprises a stripe 520a_2' by which it is connected to the chip carrier 110. The spacing between the stripes 520a_1' and 520b' should be equal to or greater than the creepage distance (cd) in order to avoid electrical breakdown. It is to be noted that the edge 120d of the power semiconductor chip 120 may be spaced apart from the chip carrier 110 by a certain distance.

In all examples described herein, power semiconductor chips 120 of high power classes could be used. In particular for high power class applications, cooling is of crucial importance because the maximum current which could be switched is strongly dependent from the operating temperature. The higher the operating temperature, the lower is the current which could be switched. For example, if a maximum switching current of about 150 A is reached at 25° C., the maximum switching current can decrease to about 75 A at 100° C.

For example, a power semiconductor chip having an operational voltage of about 1200 V and an operational current of about 30 A (at a certain operating temperature) has a switching power of 36 kW. If, e.g., 1% of the switching power is transformed to heat, a thermal power of 360 W is to be dissipated during operation. The concept heat dissipation by using a cooling fluid can, e.g., cope with thermal power dissipation of equal to or more than 200, 300, 400, 500, 600, 700, or 800 W per power semiconductor chip. Thus, high maximum switching currents for high power class semiconductor chips could be achieved.

Figure 9:
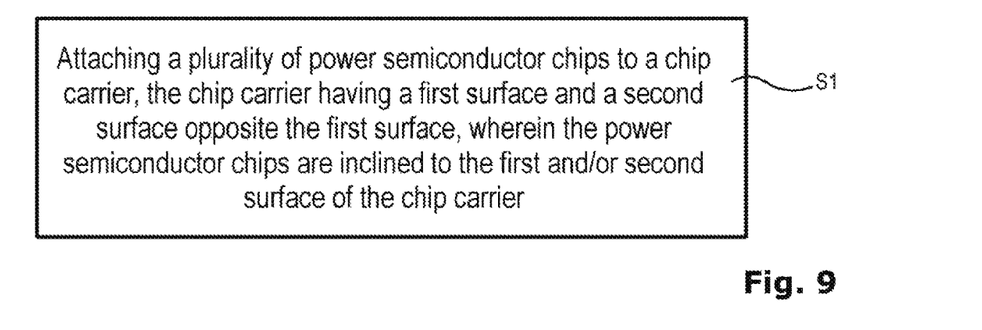
FIG. 9 is a flowchart of an exemplary process for manufacturing a semiconductor power arrangement.

FIG. 9 illustrates an exemplary method of manufacturing a semiconductor power arrangement such as, e.g., semiconductor power arrangements 100, 300, 500. The method comprises at S1 attaching a plurality of power semiconductor chips to a chip carrier, the chip carrier having a first surface and a second surface opposite the first surface, wherein the power semiconductor chips are inclined to the first and/or second surface of the chip carrier. That way both the first surface and the second surface of the power semiconductor chips are not bonded to the chip carrier. Rather, they may both be exposed to transfer heat to a surrounding medium (cooling fluid). The chip carrier, on the other hand, does not need to have a sophisticated design to optimize heat transfer and dissipation.

During operation, the container 10 is filled with a cooling fluid. The semiconductor power arrangements 100, 300, 500 and, in particular, the plurality of power semiconductor chips 120 are completely submerged in the cooling fluid.

During operation of the semiconductor power arrangement 100, 300, 500, the cooling fluid is heated and circulates by free convection in order to provide for appropriate heat dissipation. A heat exchanger (not shown) may be included in the container 10 in order to effectively remove the heat from the cooling fluid. As an advantage, the major heat removal path does not use the chip carrier 110 (e.g. PCB, DCB, leadframe, IMS, or MIS) but the cooling fluid as such, so that the power semiconductor chips 120 may be designed without encapsulation and may be mounted in an inclined or vertical orientation to the chip carrier 110. It is to be noted that the cooling fluid may further undergo a phase transition (liquid to gaseous). A phase transition may represent a further cooling mechanism which increases the cooling capacity provided by the cooling mechanism of heat removal by convection.

The cooling fluid may have a high dielectric strength of equal to or greater than 10 or 12 kV/mm. The volume electrical resistivity of the cooling fluid may be equal to or greater than 2 or $3 \times 10^{10}$ ohm-cm. The cooling fluid may have a high chemical inertness and a high chemical, physical and thermal stability. By way of example, a cooling fluid as used herein may be an organic composition having fluorine as an important component, e.g. fluorine ketones, hydrofluoroether, and fluoropolymers such as, e.g. methoxyheptafluorpropan, methoxynonafluorbutan, etc. Exemplary cooling fluids which could be used in the examples described herein are Novec™ cooling fluids produced by 3M™ such as, e.g., Novec™ 7600 Engineered Fluid.

The examples described herein may provide for many advantages such as, e.g. effective heat dissipation, low cost assembly (low cost materials, no power semiconductor chip 120 encapsulation), improved reliability, low thermal stress on the power semiconductor chips 120 during operation, since the temperature gradient between the chip carrier 110 and the power semiconductor chips 120 may be small, increased maximum operation temperature of the power semiconductor chips 120 (e.g. equal to or more than 175° C., 200° C., etc.,), increased chip density of the semiconductor power arrangement 100, 300, 500, simple cooling concept only relying on the cooling fluid, enhanced size scalability of the semiconductor power arrangement 100, 300, 500, and double-sided design or 3D (three-dimensional) design of the semiconductor power arrangement 100, 300, 500.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein.

What is claimed is:

1. A semiconductor power arrangement, comprising:
a chip carrier having a first surface and a second surface opposite the first surface and including a plurality of through-holes or slits extending through the carrier between the first surface and second surface; and
a plurality of power semiconductor chips attached to the chip carrier, each power semiconductor chip having chip electrodes on at least one of a first major surface and an opposing second major surface, wherein the power semiconductor chips pass through the through-holes or slits so as to extend from both the first and second surfaces of the chip carrier such that chip electrodes are exposed on opposing sides of the chip carrier, and wherein the power semiconductor chips are inclined to the first surface and second surface of the chip carrier.

2. The semiconductor power arrangement of claim 1, wherein the power semiconductor chips are perpendicular to the first and/or second surface of the chip carrier.

3. The semiconductor power arrangement of claim 1, wherein the power semiconductor chips are oriented parallel to each other, and wherein a distance between adjacent power semiconductor chips is equal to or less than 4.0 mm, 3.0 mm, 2.0 mm, 1.5 mm, 1.0 mm, 0.75 mm, 0.5 mm, or 0.3 mm.

4. The semiconductor power arrangement of claim 1, wherein the power semiconductor chips are bonded to the chip carrier by a soldering material, a sintering material or a plating material.

5. The semiconductor power arrangement of claim 1, wherein the power semiconductor chips are bare chips.

6. The semiconductor power arrangement of claim 1, wherein the power semiconductor chips comprise electrodes, wherein the electrodes are connected to the chip carrier either directly or via metal traces running over the power semiconductor chips.

7. The semiconductor power arrangement of claim 1, wherein the chip carrier comprises a PCB, a ceramic plate covered by a structured metallization to form the first and second surfaces thereof, a leadframe, an isolated metal substrate, or a molded interconnect substrate.

8. The semiconductor power arrangement of claim 1, wherein the chip carrier comprises an electrical wiring and an electrical connector which is electrically connected to the electrical wiring.

9. The semiconductor power arrangement of claim 1, further comprising:
a container configured to accommodate the chip carrier and the plurality of power semiconductor chips.

10. A method of manufacturing the semiconductor power arrangement of claim 1, the method comprising:
defining a chip carrier to have a first surface and a second surface opposite the first surface; and
attaching a plurality of power semiconductor chips to a chip carrier, wherein the power semiconductor chips are inclined to the first and/or second surface of the chip carrier.

11. The method of claim 10, wherein the power semiconductor chips are arranged perpendicular to the first and/or second surface of the chip carrier.

12. The method of claim 10, further comprising:
inserting the power semiconductor chips through through-holes or into slits in the chip carrier.

* * * * *